United States Patent
Choi et al.

(10) Patent No.: US 9,635,443 B2
(45) Date of Patent: Apr. 25, 2017

(54) FREQUENCY DIVISION DUPLEX WIRELESS COMMUNICATION APPARATUS AND METHOD

(71) Applicant: Samsung Electronics Co., Ltd., Suwon-si, Gyeonggi-do (KR)

(72) Inventors: Ku-Young Choi, Gumi-si (KR); Hyung-Gon Kim, Daegu (KR); Sung-Chul Park, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 351 days.

(21) Appl. No.: 14/211,946

(22) Filed: Mar. 14, 2014

(65) Prior Publication Data

US 2015/0230009 A1 Aug. 13, 2015

(30) Foreign Application Priority Data

Feb. 10, 2014 (KR) .................. 10-2014-0014868

(51) Int. Cl.
*H04Q 11/02* (2006.01)
*H04L 5/14* (2006.01)
(52) U.S. Cl.
CPC .............. *H04Q 11/02* (2013.01); *H04L 5/14* (2013.01); *H04Q 2213/13291* (2013.01)
(58) Field of Classification Search
CPC ......... H04L 27/26; H04L 5/0007; H04L 5/14; H04W 24/02; H04W 52/241; H04W 52/265; H04W 52/42; Y02B 60/50; H04Q 11/02; H04Q 2213/13291
See application file for complete search history.

(56) References Cited

U.S. PATENT DOCUMENTS

| | | | |
|---|---|---|---|
| 8,406,159 B2 | 3/2013 | Poulin et al. | |
| 2002/0016183 A1 | 2/2002 | Lehtinen | |
| 2006/0019712 A1 | 1/2006 | Choi | |
| 2008/0316947 A1 | 12/2008 | Lindoff et al. | |
| 2009/0131010 A1 | 5/2009 | Oshima et al. | |
| 2009/0323582 A1* | 12/2009 | Proctor, Jr. ............. | H04B 7/04 370/315 |
| 2011/0175789 A1* | 7/2011 | Lee ....................... | H01Q 1/243 343/853 |

FOREIGN PATENT DOCUMENTS

KR 10-2000-0001230 A 1/2000

* cited by examiner

*Primary Examiner* — Ayaz Sheikh
*Assistant Examiner* — Debebe Asefa
(74) *Attorney, Agent, or Firm* — Jefferson IP Law, LLP

(57) ABSTRACT

A Frequency Division Duplex (FDD) wireless communication apparatus is provided. The FDD wireless communication apparatus includes a first antenna configured to one of transmit and receive, a second antenna configured to receive, and a switch configured to selectively connect one of the first antenna and the second antenna to a receiver.

17 Claims, 4 Drawing Sheets

FREQUENCY DIVISION DUPLEX WIRELESS COMMUNICATION APPARATUS AND METHOD

CROSS-REFERENCE TO RELATED APPLICATION(S)

This application claims the benefit under 35 U.S.C. §119 (a) of a Korean patent application filed on Feb. 10, 2014 in the Korean Intellectual Property Office and assigned Serial number 10-2014-0014868, the entire disclosure of which is incorporated herein by reference.

TECHNICAL FIELD

The present disclosure relates to a Frequency Division Duplex (FDD) wireless communication apparatus and method.

BACKGROUND

A wireless communication apparatus may use one common antenna for transmission and reception or use a separate dedicated antenna for each of transmission and reception. When the common antenna is used, a transmission signal and a reception signal need to be separated for a Radio Frequency (RF) signal passing via one antenna.

To separate the transmission signal and the reception signal, a duplexer may be used. The duplexer is connected between an antenna, and a transmitter and a receiver. The duplexer provides a transmission signal output from the transmitter to the antenna, and provides a reception signal received via the antenna to the receiver.

A wireless communication scheme such as Code Division Multiple Access (CDMA) voice or Long Term Evolution (LTE) employs Frequency Division Duplex (FDD). Typically, an FDD wireless communication apparatus uses one common antenna for transmission and reception, and separates a transmission signal and a reception signal by using a duplexer. In FDD, the transmission signal and the reception signal may be transmitted and received at the same time via the common antenna unlike in Time Division Duplex (TDD).

Accordingly, an FDD wireless communication apparatus and method for improving reception sensitivity is desired.

The above information is presented as background information only to assist with an understanding of the present disclosure. No determination has been made, and no assertion is made, as to whether any of the above might be applicable as prior art with regard to the present disclosure.

SUMMARY

Even when the duplexer is used in Frequency Division Duplex (FDD), perfect isolation between a transmission end and a reception end is not implemented in an actual. When the transmission signal is radiated, an interference signal caused by the transmission signal is delivered to the reception end through air-coupling, degrading reception sensitivity. Moreover, such interference limits increasing a transmit power.

Aspects of the present disclosure are to address at least the above-mentioned problems and/or disadvantages and to provide at least the advantages described below. Accordingly, an aspect of the present disclosure is to provide an FDD wireless communication apparatus and method for improving reception sensitivity.

Another aspect of the present disclosure is to provide an FDD wireless communication apparatus and method for improving isolation between a transmission end and a reception end.

Another aspect of the present disclosure is to provide an FDD wireless communication apparatus and method for solving a transmit power limitation problem caused by imperfect isolation between a transmission end and a reception end.

Another aspect of the present disclosure is to provide an FDD wireless communication apparatus and method for improving reception sensitivity by using a Low Noise Amplifier (LNA) in a front end of a receiver.

In accordance with an aspect of the present disclosure, a FDD wireless communication apparatus is provided. The FDD wireless communication apparatus includes a first antenna configured to one of transmit and receive, a second antenna configured to receive, and a switch configured to selectively connect one of the first antenna and the second antenna to a receiver.

In accordance with an aspect of the present disclosure, a Frequency Division Duplex (FDD) wireless communication apparatus is provided. The FDD wireless communication apparatus includes multiple transmitters and receivers corresponding to multiple different communication bands, a first antenna configured to one of transmit and receive, a second antenna configured to receive, a first switch configured to selectively connect the first antenna to a transmitter corresponding to a communication band used out of the multiple communication bands, and a second switch configured to selectively connect one of the first antenna and the second antenna to a receiver corresponding to the used communication band through the first switch.

In accordance with another aspect of the present disclosure, a FDD wireless communication method is provided. The FDD wireless communication method includes connecting one of a first antenna for one of transmitting and receiving and a second antenna for receiving to a receiver, and receiving a wireless signal via the antenna connected to the receiver.

Other aspects, advantages, and salient features of the present disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
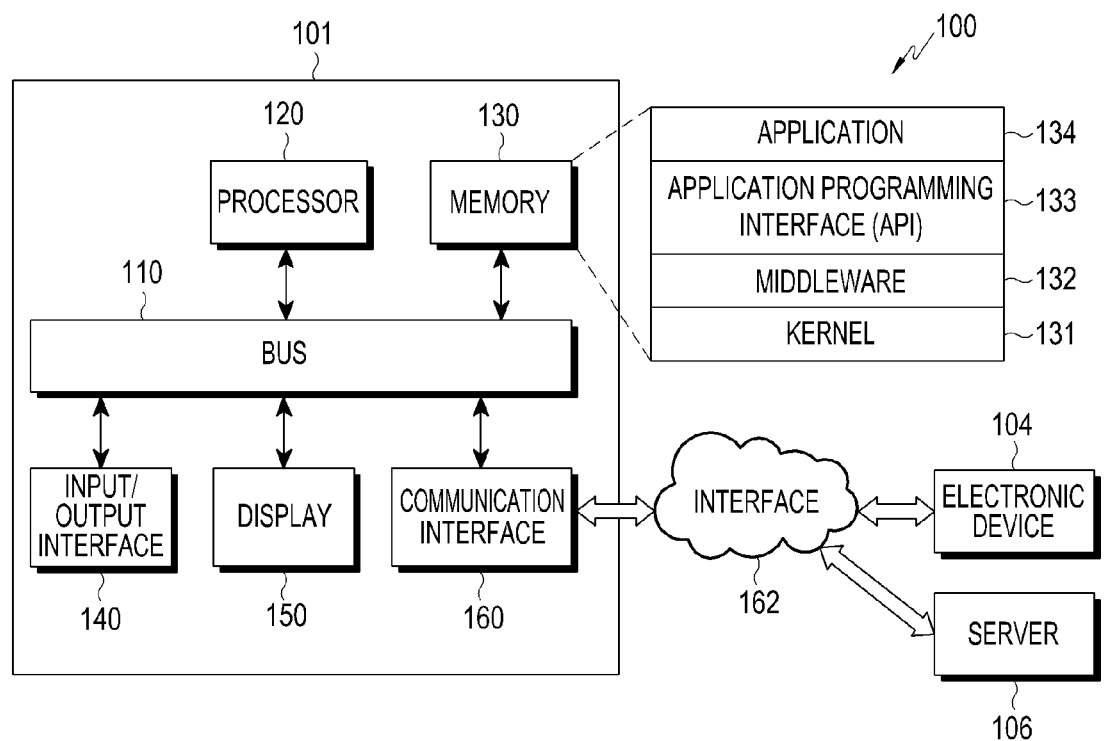
FIG. 1 is a block diagram illustrating a network environment including an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Terms "include" or "may include" used in various embodiments of the present disclosure indicate an existence of disclosed function, operation, or component, but do not limit an existence of at least one other function, operations, or components. Terms "include" or "has" used in the present disclosure should be understood that they are intended to indicate an existence of feature, number, step, operation, element, component or any combination thereof, disclosed in the specification, but should not be understood that they are intended to previously exclude an existence of at least one other feature, numbers, steps, operations, elements, components, or any combination thereof or possibility of adding those things.

In various embodiments of the present disclosure, the term "or" includes any and all combinations of words listed together. For example, "A or B" may include only A, only B, or both A and B.

Terms such as "first" or "second" used in various embodiments of the present disclosure may be used to describe various elements of various embodiments, but do not limit the elements. For example, the terms do not limit an order and/or importance of the elements. The terms are used to distinguish one element from another. For example, a first user device and a second user device are user devices and indicate different user devices. For example, without departing from the scope of various embodiments of the present disclosure, a first element may be referred to as a second element and likewise the second element may be referred to as the first element.

When an element is described as being "coupled to" or "connected to" another element, it should be appreciated that the former element may be directly coupled or connected to the latter element, but they may be coupled or connected together through at least one intervening element. In contrast, when an element is described as being "directly coupled to" or "directly connected to" another element, it should be appreciated that they are coupled or connected together without the intervention of some other element.

The terms used in various embodiments of the present disclosure are only used to describe particular embodiments, and are not intended to limit the various embodiments of the present disclosure. The singular forms include plural forms as well, unless the context clearly indicates otherwise.

Unless defined otherwise, all terms used herein have the same meanings as generally understood by those having ordinary knowledge in the technical field to which the present disclosure pertains. Terms generally used and defined in dictionaries should be interpreted as having meanings consistent with meanings construed in the context of the related art, and should not be interpreted as having ideal or excessively formal meanings unless defined explicitly in this application.

The Frequency Division Duplex (FDD) wireless communication apparatus according to various embodiments of the present disclosure may be included in an electronic device. Examples of the electronic device may include at least one of and/or combinations of a smartphone, a tablet Personal Computer (PC), a mobile phone, a video phone, an electronic(e)-book reader, a desktop PC, a laptop PC, a netbook computer, a Personal Digital Assistant (PDA), a Portable Multimedia Player (PMP), an MPEG-1 audio layer-3 (MP3) player, a mobile medical equipment, a camera, and a wearable device (for example, a Head-Mounted-Device (HMD) such as electronic glasses, electronic clothes, electronic bracelets, electronic necklaces, electronic appcessories, electronic tattoos, or smart watches).

According to some embodiments of the present disclosure, the electronic device may be a smart home appliance including a communication function. Examples of the smart home appliance may include at least one of a TV, a Digital Video Disk (DVD) player, audio equipment, a refrigerator, an air conditioner, a vacuum cleaner, an oven, a microwave oven, a laundry machine, an air cleaner, a set-top box, a TV box (for example, Samsung's HomeSync™, Apple's TV™, or Google's TV™), game consoles, electronic dictionaries, electronic keys, camcorders, and electronic picture frames.

According to some embodiments of the present disclosure, examples of the electronic device may include various medical equipment (for example, a Magnetic Resonance Angiography (MRA), Magnetic Resonance Imaging (MRI), Computed Tomography (CT), a moving camera, ultrasonic equipment, and so forth), a navigation device, a Global Positioning System (GPS) receiver, an Event Data Recorder (EDR), a Flight Data Recorder (FDR), a vehicle infotainment device, ship electronic equipment (for example, a ship navigation system, a gyro compass, and so forth), avionics, security devices, vehicle head units, industrial and/or home robots, Automatic Teller's Machines of financial institutions, and Points of Sales (POS).

According to some embodiments of the present disclosure, examples of the electronic device may include at least one of furniture and/or a part of a building/structure including a communication function, an electronic board, an electronic signature receiving device, a projector, and/or various measurement devices (for example, a water, gas, or electric wave measuring device).

An electronic device including an FDD wireless communication apparatus according to various embodiments of the present disclosure may be a combination of one and/or more of the foregoing devices. The electronic device according to various embodiments of the present disclosure may be a flexible device. It may also be obvious to those of ordinary skill in the art that the electronic device according to various embodiments of the present disclosure is not limited to the above-described devices.

FIG. 1 illustrates a network environment including an electronic device according to an embodiment of the present disclosure.

Referring to FIG. 1, in the network environment 100 the electronic device 101 may include a bus 110, a processor 120, a memory 130, an input/output interface 140, a display 150, and a communication interface 160. The bus 110 may be a circuit that connects elements of the electronic device 101 and delivers communication (for example, a control message) between the elements.

The processor 120 may receive a command from other elements (for example, the memory 130, the input/output interface 140, the display 150, and the communication interface 160), for example, through the bus 110, interprets the received command, and may perform an operation and/or data processing corresponding to the interpreted command.

According to an embodiment of the present disclosure, a controller may include the processor 120 and the memory 130 for storing information needed by the processor 120. The controller may control the overall operation of the electronic device 101 and may perform an operation corresponding to a wireless communication method according to an embodiment of the present disclosure, as a Central Processing Unit (CPU).

The memory 130 may store a command and/or data received from and/or generated by the processor 120 and/or other elements. For example, the input/output interface 140, the display 150, and the communication interface 160. The memory 130 may include, for example, programming modules such as a kernel 131, middleware 132, an Application Programming Interface (API) 133, and an application 134. Each programming module may include software, firmware, hardware, or a combination of at least two of them.

The kernel 131 may control and/or manage system resources, for example, the bus 110, the processor 120, or the memory 130, used to execute operations and/or functions implemented in the other programming modules, for example, the middleware 132, the API 133, and/or the application 134. The kernel 131 provides an interface through which the middleware 132, the API 133, and/or the application 134 accesses a separate element of the electronic device 101 to control and/or manage the element.

The middleware 132 may perform a relay operation to allow the API 133 and/or the application 134 to exchange data by communicating with the kernel 131. In association with work requests received from the application 134, the middleware 132 may perform control, for example, scheduling and/or load balancing, over a work request by using a method such as assigning to at least one of the application 134 a priority for using a system resource of the electronic device 101. For example, the bus 110, the processor 120, and/or the memory 130.

The API 133 may be an interface used for the application 134 to control a function provided by the kernel 131 and/or the middleware 132, and may include, for example, at least one interface and/or function, for example, a command, for file control, window control, image processing and/or character control.

The input/output interface 140 may deliver a command and/or a data input from a user through an input/output device. For example, the command and/or the data input may be received via a sensor, a keyboard, and/or a touch screen, and transmitted to the processor 120, the memory 130, and the communication interface 160, through the bus 110. For example, the input/output interface 140 may provide data about a user's touch input through the touch screen to the processor 120. According to an embodiment of the present disclosure, the input device of the input/output interface 140 may include a touch panel, a (digital) pen sensor, a key, and/or an ultrasonic input device. The touch panel may recognize a touch input using at least one of a capacitive, resistive, infrared, and/or ultrasonic scheme. The touch panel may further include a control circuit. For the capacitive scheme, physical contact and/or proximity recognition is possible. The touch panel may further include a tactile layer. In the case of a tactile layer, the touch panel may provide a tactile reaction to the user. The input/output interface 140 may output, for example, a command and/or data received from the processor 120, the memory 130, and/or the communication interface 160, through the bus 130, through the input/output device. For example, a speaker and/or a display.

The display 150 may display information, for example, multimedia data and/or text data, to the user.

The communication interface 160 may connect communication between the electronic device 101 and an external device. For example, an electronic device 104 and/or a server 106. For example, the communication interface 160 may be connected to a network 162 through wireless communication or wired communication to communicate with the external device. Wireless communication may include, for example, at least one of Wireless Fidelity (WiFi), Bluetooth (BT), Near Field Communication (NFC), Global Positioning System (GPS), and cellular communication (for example, LTE, LTE-A, CDMA, WCDMA, UMTS, WiBro, or GSM). Wired communication may include at least one of, for example, Universal Serial Bus (USB), High Definition Multimedia Interface (HDMI), Recommended Standard (RS)-232, and a Plain Old Telephone Service (POTS).

According to an embodiment of the present disclosure, the communication interface 160 may include an FDD wireless communication device.

According to an embodiment of the present disclosure, the network 162 may be a telecommunications network. The telecommunications network may include at least one of a computer network, Internet, Internet of things, and a telephone network. According to an embodiment, a protocol, for example, a transport layer protocol, a data link layer protocol, and/or a physical layer protocol, for communication between the electronic device 101 and the external device may be supported in at least one of the application 134, the API 133, the middleware 132, the kernel 131, and the communication interface 160.

Figure 2:
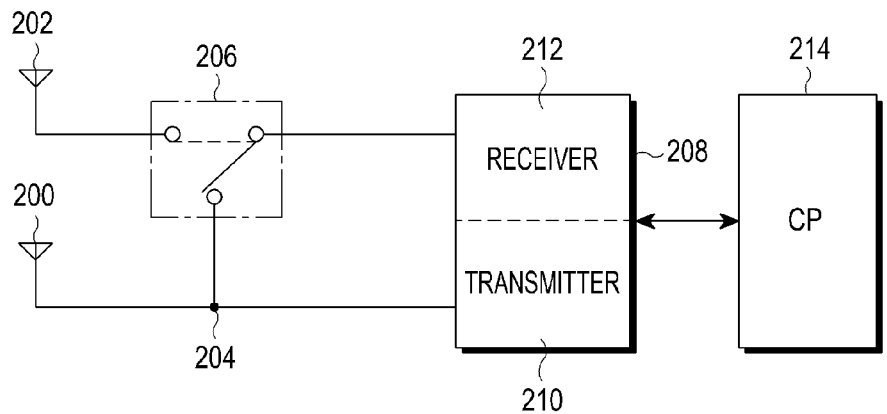
FIG. 2 is a block diagram illustrating a Frequency Division Duplex (FDD) wireless communication apparatus according to an embodiment of the present disclosure.

FIG. 2 is a block diagram illustrating an FDD wireless communication apparatus according to an embodiment of the present disclosure.

Referring to FIG. 2, the wireless communication apparatus may include a first antenna 200, a second antenna 202, a switch 206, an RF transceiver 208, and a Communication Processor (CP) 214. The first antenna 200 may be a main antenna that is used for transmission or reception. The second antenna 202 may be an antenna that used for reception. The switch 206 may selectively connect one of the first antenna 200 and the second antenna 202 to a receiver 212 of the RF transceiver 208. The switch 206 is an RF switch for which a Single Pole Double Throw (SPDT) switch may be used.

The RF transceiver 208 may include a transmitter 210 and the receiver 212. The RF transceiver 208 is connected to the CP 214. The transmitter 210 of the RF transceiver 208 converts a transmission baseband signal input from the CP 214 into an RF signal and outputs the RF signal. An RF transmission signal output from the transmitter 210 is transmitted via the first antenna 200. The receiver 212 of the RF transceiver 208 converts an RF reception signal received via the first antenna 200 or the second antenna 202 connected by the switch 206 into a baseband signal and outputs the baseband signal to the CP 214.

The CP 214 processes a baseband signal corresponding to transmission and reception. For example, if the wireless communication apparatus is used for wireless communication of an LTE type, a communication modem chip, such as MDM9615M of Qualcomm, may be used for the CP 214. The CP 214 may be connected to a processor such as an Application Processor (AP) that may be included in an electronic device including the wireless communication apparatus.

A junction 204 among the first antenna 200, the transmitter 210, and the switch 206 may be one of a combination of a T-junction, a transmission Surface Acoustic Wave (SAW) filter, and a reception SAW filter, a circulator, and a duplexer.

Switching of the switch 206 may be controlled by the controller of the wireless communication apparatus or the electronic device. The CP 214 may be used as the controller for controlling switching of the switch 206. As another example, the controller may be separately implemented. As further another example, the controller may be implemented with the processor such as the AP that may be included in the electronic device including the wireless communication apparatus. For example, the controller may be implemented with the processor 120 of the electronic device 101 illustrated in FIG. 1. The controller may control switching of the switch 206 based on a received signal power level.

Although not shown in FIG. 2, like in a general wireless communication apparatus, at least one Band Pass Filter (BPF) for bandpass-filtering a received signal for a reception band may be added to a reception path and at least one BPF for bandpass-filtering a transmission signal for a transmission band may be added to a transmission path. At least some of the BPFs may be included in the RF transceiver 208. A power amplifier for power-amplifying the transmission signal may also be added to the transmission path.

Figure 3:
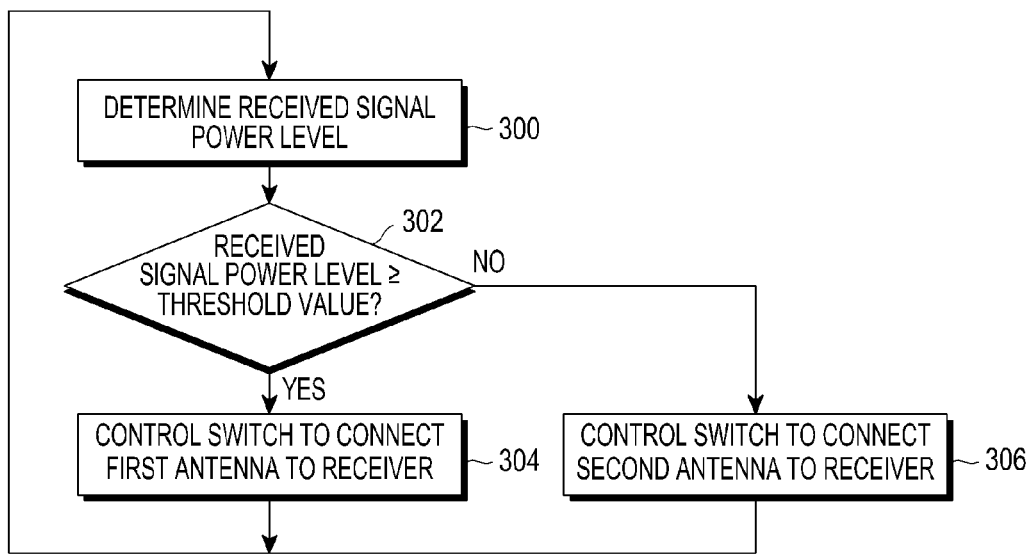
FIG. 3 is a flowchart illustrating antenna switching control according to an embodiment of the present disclosure.

FIG. 3 is a flowchart illustrating antenna switching control according to an embodiment of the present disclosure.

Referring to FIG. 3, the controller determines a received signal power level in operation 300. For example, for LTE, the received signal power level may be determined by measuring a Reference Signal Received Power (RSRP). The controller may be the CP 214 as described above, and thus a description will be made using an example in which antenna switching control illustrated in FIG. 3 is performed by the CP 214.

The CP 214 determines whether the received signal power level is greater than or equal to a threshold value in operation 302. The threshold value may be preset as a level for determining whether a received electric field of the wireless communication apparatus is a weak electric field. For example, for RSRP, the threshold value may be set to −115 dBm. If the received signal power level is greater than or equal to the threshold value, the wireless communication apparatus may be determined to be located in a strong electric field region. If the received signal power level is less than the threshold value, the wireless communication apparatus may be determined to be located in a weak electric field region.

If the received signal power level is greater than or equal to the threshold value in operation 302, the CP 214 controls the switch 206 to select the first antenna 200 for connection of the first antenna 200 to the receiver 212 in operation 304. Thus, the wireless communication apparatus may receive a wireless signal via the first antenna 200.

If the received signal power level is less than the threshold value in operation 302, the CP 214 controls the switch 206 to select the second antenna 202 for connection of the second antenna 202 to the receiver 212 in operation 306. Thus, the wireless communication apparatus may receive a wireless signal via the second antenna 202.

The CP 214 performs operation 300 after operation 304 or operation 306. Thus, during the use of the wireless communication apparatus, switching of the first antenna 200 and the second antenna 202 may be continued based on the received signal power level. Thus, the wireless communication apparatus may transmit and receive a signal via the first antenna 200 in the strong electric field region and may transmit a signal via the first antenna 200 and may receive a signal via the second antenna 202 in the weak electric field region.

Thus, the first antenna 200 used for transmission or reception and the second antenna 202 used for reception may be selectively used as a reception antenna by switching of the switch 206. Hence, the second antenna 202 may be used as a reception antenna separately from the first antenna 200, thereby improving isolation between a transmission end and a reception end. Since interference of a reception signal is reduced due to a transmission signal, reception sensitivity may be improved also in the weak electric field region. Also, transmission power limitation caused by the isolation problem between the transmission end and the reception end may be addressed. In this way, the reception sensitivity is improved and the transmit power is further enhanced, thereby solving the call drop problem in the weak electric field region.

Moreover, since a separate reception antenna is used, a main antenna may be intensively implemented in a transmission band and may also be easily implemented to cover a large-bandwidth communication band. For example, in the FDD communication band, an LTE band 4 (Advanced Wireless Service: AWS) has a transmission band of 1,710-1,755 MHz and a reception band of 2,110-2,155 MHz, in which a band gap between the transmission band and the reception band is 355 MHz. As such, it is not easy to cover a large bandwidth with a single antenna.

On the other hand, as described before, if the first antenna 200 and the second antenna 202 are separately used as a transmission antenna and a reception antenna, the first antenna 200 may be implemented intensively in the transmission band and the second antenna 202 may be implemented intensively in the reception band. For example, for the LTE band 4, a reception band is 2,110-2,155 MHz, such that the size of the second antenna 202 may be implemented with a short length of 2-3 mm.

Figure 4:
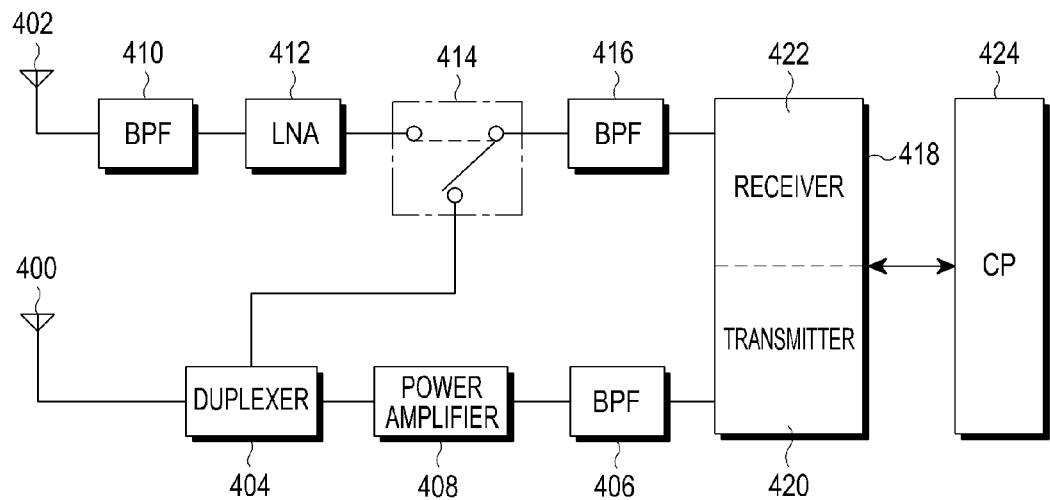
FIG. 4 is a block diagram illustrating an FDD wireless communication apparatus according to another embodiment of the present disclosure.

FIG. 4 is a block diagram illustrating an FDD wireless communication apparatus according to another embodiment of the present disclosure.

Referring to FIG. 4, the wireless communication apparatus may include a first antenna 400, a second antenna 402, a switch 414, an RF transceiver 418, and a CP 424. In FIG. 4, the wireless communication apparatus includes an LNA 412 in a reception path and implements a junction such as the junction 204 of FIG. 2 with a duplexer 404. Also, BPFs 410 and 416 are included in the reception path, and a BPF 406 and a power amplifier 408 are included in the transmission path. The first antenna 400, the second antenna 402, the switch 414, the RF transceiver 418, and the CP 424 may correspond to the first antenna 200, the second antenna 202, the switch 206, the RF transceiver 208, and the CP 214 of FIG. 2, respectively. Therefore, an unnecessarily repeated description of those elements will be omitted.

The duplexer 404 is connected among the first antenna 400, the transmitter 420 of the RF transceiver 418, and the switch 414 to separate a transmission signal to be transmitted via and a reception signal received via the first antenna 400. The power amplifier 408 may be connected between the duplexer 404 and the transmitter 402. The power amplifier 408 power-amplifies a transmission signal output from the transmitter 420 and provides the power-amplified transmission signal to the duplexer 404. The BPF 406 may be further connected between the transmitter 420 and the power amplifier 406. The BPF 406 bandpass-filters the transmission signal output from the transmitter 420 and provides the bandpass-filtered transmission signal to the power amplifier 408. An SAW filter may be used as the BPF 406.

A BPF 410 connected between the second antenna 402 and an LNA 412 bandpass-filters a signal received via the second antenna 402 for a reception band, and provides the bandpass-filtered signal to the LNA 412. The LNA 412 low-noise-amplifies a signal output from the BPF 410 and provides the low-noise-amplified signal to the switch 414. The BPF 416 bandpass-filters a signal input through the switch 414 for the reception band and provides the bandpass-filtered signal to the receiver 422 of the RF transceiver 418. The BPF 410 is used as a pre-filter prior to low-noise-amplification of the LNA 412.

The RF transceiver 418 may include the transmitter 420 and the receiver 422. The RF transceiver 418 is connected to the CP 424. The transmitter 420 of the RF transceiver 428 converts a transmission baseband signal input from the CP 424 into an RF signal and outputs the RF signal. The RF transmission signal output from the transmitter 420 is transmitted through the BPF 406, the power amplifier 408, and the duplexer 404 via the first antenna 400. The receiver 422 of the RF transceiver 418 converts an RF reception signal received via one of the first antenna 400 and the second antenna 402, which is connected by the switch 414, into a baseband signal and outputs the baseband signal to the CP 424.

As provided in the description made with reference to FIG. 2, at least some of the BPFs 406, 410, and 416 may be included in the RF transceiver 418. Switching of the switch 414 may be controlled by the controller of the wireless communication apparatus and/or the electronic device, for example, by the CP 424 as described with reference to FIG. 2. Thus, the CP 424 may control switching of the switch 414 based on a received signal power level. Switching control over the switch 414 by the controller, such as the CP 424, may be performed in the same manner as switching control over the switch 206 by the CP 214 as described with reference to FIG. 3.

Therefore, the first antenna 400 used for transmission or reception and the second antenna 402 used for reception may be selectively used as a reception antenna by switching of the switch 414. If the second antenna 402 is connected to the receiver 422, a signal received via the second antenna 402 is low-noise-amplified by the LNA 412 and then provided to the receiver 422. Hence, by using the LNA 412 for a reception signal in a weak electric field region, reception sensitivity may be further improved.

For common use of one antenna and a duplexer for both transmission and reception without use of a separate reception antenna, using an LNA in a front end of a receiver may be considered to enhance reception sensitivity. If the LNA is used after a transmission signal interferes with a reception signal, the interfered reception signal is amplified by the LNA. Thus, reception sensitivity may be improved by disposing the LNA in a front end of an antenna port of the duplexer for connecting the antenna to the duplexer. However, the antenna port of the duplexer is used not only as the reception path, but also as the transmission path, such that it is impossible to use the LNA between the antenna port of the duplexer and the antenna.

On the other hand, if the second antenna 402 is connected to the receiver 422 in the embodiment of FIG. 4, a signal received via the second antenna 402 is low-noise-amplified by the LNA 412 and then provided to the receiver 422. Hence, by using the LNA 412 irrespective of the duplexer 404, reception sensitivity for the reception signal may be improved in the weak electric field region.

If the wireless communication apparatus is in the strong electric field region, the signal received via the first antenna 400, instead of via the second antenna 402, is provided to the receiver 422 through the switch 414, such that the BPF 410 and the LNA 412 are not used. In this case, the CP 424 may control the BPF 410 and the LNA 412 not to operate. Thus, power consumption of the BPF 410 and the LNA 412 may be reduced.

Figure 5:
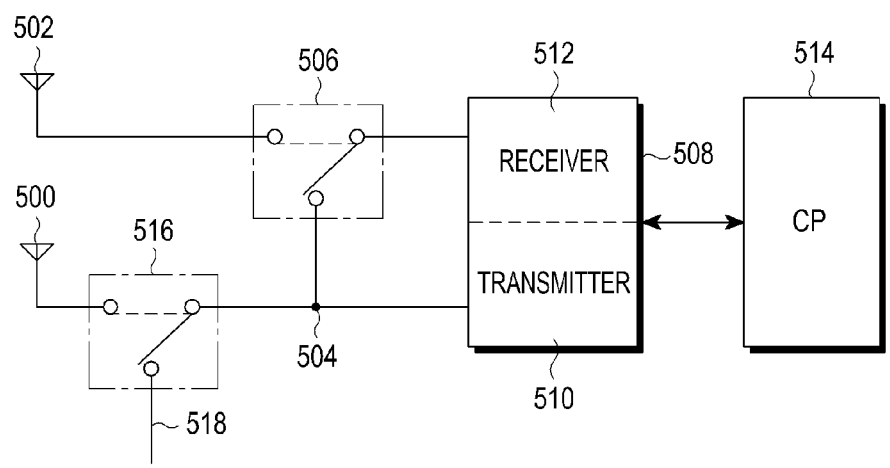
FIG. 5 is a block diagram illustrating an FDD wireless communication apparatus according to further another embodiment of the present disclosure.

FIG. 5 is a block diagram illustrating an FDD wireless communication apparatus according to further another embodiment of the present disclosure.

Referring to FIG. 5, the wireless communication apparatus may include a first antenna 500, a second antenna 502, a switch 506, an RF transceiver 508 including a transmitter 510 and a receiver 512, and a CP 514. In FIG. 5, the wireless communication apparatus includes an RF switch connector 516. The first antenna 500, the second antenna 502, the junction 504, the switch 506, the RF transceiver 508, and the CP 514 may correspond to the first antenna 200, the second antenna 202, the junction 204, the switch 206, the RF transceiver 208, and the CP 214 of FIG. 2, respectively. Thus, an unnecessarily repeated description of those components will not be provided.

The RF switch connector 516 may be used to test the wireless communication apparatus. The test may include a test of transmission and reception of the wireless communication apparatus by using test equipment. The test may also include calibration performed during production of the wireless communication apparatus.

The RF switch connector 516 selectively connects the junction 504 between the transmitter 510 and the switch 506 to one of the first antenna 500 and a cable 518. Like a typical RF switch connector, the RF switch connector 516 may be switched depending on whether a plug of the cable 518 is inserted into the RF switch connector 516. The cable 518 may be a test cable used to connect the test equipment to the wireless communication apparatus through the RF switch connector 516. If the plug of the cable 518 has not been inserted into the RF switch connector 516, the RF switch connector 516 connects the junction 504 to the first antenna 500. Once the plug of the cable 518 is inserted into the RF switch connector 516, the RF switch connector 516 connects the junction 504 to the cable 518. In FIG. 5, the plug of the cable 518 is inserted into the RF switch connector 516, such that the junction 504 is connected to the cable 518.

When the plug of the cable 518 is inserted into the RF switch connector 516 and the test equipment is connected to the junction 504 through the cable 518, the CP 514 controls switching of the switch 506 to correspond to a test. For example, the test may be carried out according to a command sent from a Personal Computer (PC) connected to an electronic device including the wireless communication apparatus illustrated in FIG. 5. If the wireless communication apparatus is included in the electronic device 101 illustrated in FIG. 1, the PC may be connected to the electronic device 101 through a USB and/or a serial port (for example, RS-232) that may be included in the communication interface 160 of the electronic device 101. The PC may perform a test and calibration while controlling the test equipment and the electronic device 101.

In the test, the CP 514 may connect the receiver 512 to the RF switch connector 516 through the switch 506. Then, a path in which the cable 518 is connected to the receiver 512 through the RF switch connector 516 and the switch 506 is formed, such that a reception test may be performed by the test equipment. The RF switch connector 516 is also connected to the transmitter 510 through the junction 504, such that a transmission test may also be carried out through the RF switch connector 516.

If there is no switch 506, separate RF switch connectors need to be used for an output path of the transmitter 510 and an input path of the receiver 512 to test the transmitter 510 and the receiver 512. However, the receiver 512 may be connected to the RF switch connector 516 through the switch 506, such that both the transmitter 510 and the receiver 512 may be tested using one RF switch connector 516. Thus, the number of RF switch connectors for a test may be reduced and a space necessary for installation of the RF switch connectors may also be reduced.

Figure 6:
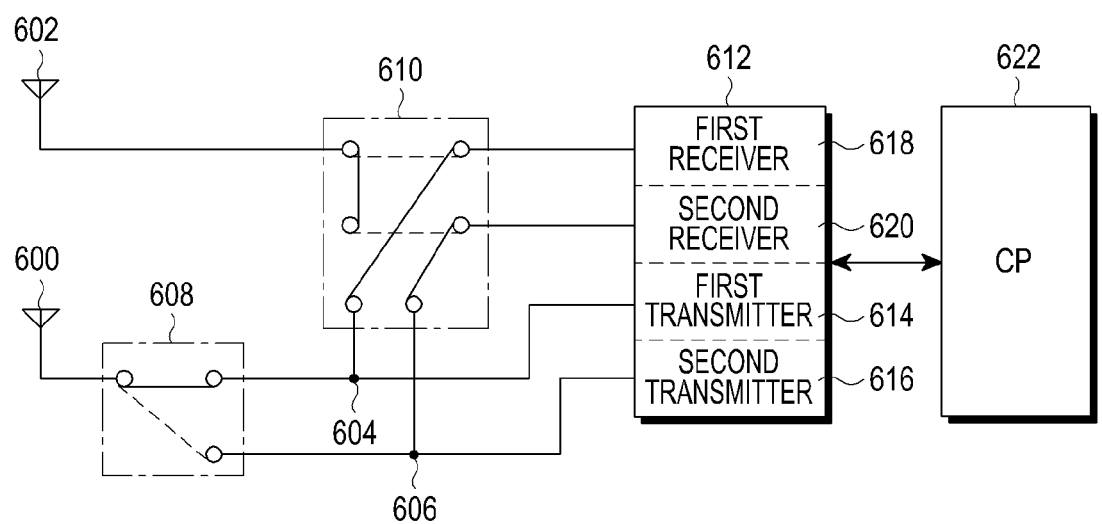
FIG. 6 is a block diagram illustrating an FDD wireless communication apparatus according to yet another embodiment of the present disclosure.

FIG. 6 is a block diagram illustrating an FDD wireless communication apparatus according to yet another embodiment of the present disclosure.

Referring to FIG. 6, the wireless communication apparatus may include a first antenna 600, a second antenna 602, switches 608 and 610, an RF transceiver 612 including a first transmitter 614 and a second transmitter 616 and a first receiver 618 and a second receiver 620, and a CP 622. In FIG. 6, the wireless communication apparatus selects the first antenna 600 used for transmission or reception and the second antenna 602 used for reception for multiple different communication bands, for example, two neighboring communication bands, based on switching, and uses the selected antenna as a reception antenna. The first antenna 600, the second antenna 602, the junctions 604 and 606, the switch 610, the RF transceiver 612, and the CP 622 may correspond to the first antenna 200, the second antenna 202, the junction 204, the switch 206, the RF transceiver 208, and the CP 214 of FIG. 2, respectively. Thus, an unnecessarily repeated description of those components will not be provided.

The wireless communication apparatus illustrated in FIG. 6 is used for two communication bands, such that the wireless communication apparatus may include a switch 608 for selectively connecting the first antenna 600 to the first transmitter 614 and the second transmitter 616 to correspond to a communication band used out of the two communication bands. The switch 608 is an RF switch for which a SPDT switch may be used. The RF transceiver 612 may include two transmitters and two receivers for processing signals of the two communication bands, respectively, that is, the first transmitter 614 and the second transmitter 616 and the first receiver 618 and the second receiver 620. The switch 610 may selectively connect one of the first antenna 600 through the junctions 604 and 606 and the second antenna 602 to the first receiver 618 and the second receiver 620. The switch 610 is an RF switch for which a Double Pole Four Throw (DP4T) switch may be used.

Switching of the switch 610 may be controlled by the controller of the wireless communication apparatus or the electronic device as described above with reference to FIG. 2, and for example, by the CP 622. Thus, the CP 622 may control switching of the switch 610 based on a received signal power level. Switching control over the switch 610 by the CP 622 may be performed in the same manner as switching control over the switch 206 by the CP 214.

Therefore, the first antenna 600 used for transmission or reception and the second antenna 602 used for reception may be selectively used as a reception antenna for different communication bands by switching of the switch 610.

Switching of the switch 608 may also be controlled by the CP 622. The CP 622 controls the switch 608 corresponding to a communication band used out of two communication bands to connect the first antenna 600 to one of the first transmitter 614 and the second transmitter 616.

Each of elements of the foregoing electronic device and/or wireless communication apparatus according to various embodiments of the present disclosure may include at least one component, and a name of each element may vary depending on a type of the electronic device. The electronic device according to various embodiments of the present disclosure may include at least one of the elements and some elements may be omitted or additional other elements may be further included. Some of the elements of the electronic device according to various embodiments of the present disclosure may be coupled to form one entity that performs the same functions as those of the elements that are coupled.

For example, those of ordinary skill in the art may easily understand that based on the embodiment of FIG. 6, for a more number of multiple communication bands, substantially in the same manner, an antenna used for transmission or reception and an antenna used for reception may be selectively used as a reception antenna by switching. Also, those of ordinary skill in the art may easily understand that the wireless communication apparatus illustrated in FIG. 6 may further include an LNA as illustrated in FIG. 4 or may further include an RF switch connector as illustrated in FIG. 5 to implement a test.

Moreover, those of ordinary skill in the art may also easily understand that also in the embodiment illustrated in FIG. 4, the RF switch connector may be further included as illustrated in FIG. 5 to implement a test. In the embodiment illustrated in FIG. 4, positions or number of BPFs 406, 410, and 416 may change according to designing.

The term "module" used in various embodiments of the present disclosure refers to, for example, a unit including a combination of hardware, software, or firmware. The "module" may be interchangeably used with a term such as a unit, logic, a logical block, a component, or a circuit. The "module" may be a minimum unit of an integrally configured component or a part thereof. The "module" may be a minimum unit that performs at least one function or a part thereof. The "module" may be mechanically or electronically implemented. For example, the "module" according to various embodiments of the present disclosure may include at least one of Application-Specific Integrated Circuit (ASIC) chips, Field-Programmable Gate Arrays (FPGAs), or programmable-device devices, which are known or are to be developed to perform certain operations.

According to various embodiments, at least a part of a device (for example, modules or functions thereof) or method (for example, operations) according to various embodiments of the present disclosure may be implemented as an instruction stored in a computer-readable storage medium that may be read by a computer in the form of a programming module. When an instruction is executed by at least one processor (for example, the processor 120), the at least one processor may perform a function corresponding to the instruction. The computer-readable storage medium may be, for example, the memory 130. At least a part of the programming modules may be implemented (for example, executed) by the processor 120. At least a part of the programming modules may include, for example, modules, programs, routines, sets of instructions, or processes, to perform at least one function.

Examples of the computer-readable storage medium may include magnetic media such as hard disks, floppy disks and magnetic tapes, optical media such as Compact Disc Read Only Memory (CD-ROM), and Digital Versatile Disc (DVD), magneto-optical media such as floptical disks, and hardware devices that are particularly configured to store and execute a program command (for example, a programming module), such as Read Only Memories (ROMs), Random Access Memories (RAMs), and flash memories.

Examples of the program command may include a high-level language code that is executed by a computer by using an interpreter or the like as well as a machine language that is produced by a compiler. The hardware device may be configured to serve as at least one software module, in order to perform operations according to various embodiments of the present disclosure, or vice versa.

The module or programming module according to various embodiments of the present disclosure may include at least one of the foregoing elements or some of them may be omitted, or the module or programming module may further include additional other elements. Operations executed by the module, the programming module, or other elements according to various embodiments of the present disclosure may be executed in a sequential, parallel, repeated, or heuristic manner. Some operations may be executed in another order or omitted, or other operations may be added.

Other effects that may be obtained or expected from the embodiment of the present disclosure are explicitly or implicitly disclosed in the detailed description of the embodiment of the present disclosure. That is, various effects expected from the embodiment of the present disclosure have been disclosed in the detailed description of the present disclosure.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A frequency division duplex (FDD) wireless communication apparatus comprising:
    a first antenna configured to one of transmit or receive;
    a second antenna configured to receive;
    a switch configured to selectively connect one of the first antenna or the second antenna to a receiver; and
    at least one processor configured to:
        control switching of the switch based on a received signal power level,
        control to transmit and receive a signal via the first antenna, if the received signal power level is greater than or equal to a threshold value, and
        control to transmit a signal via the first antenna and receive a signal via the second antenna, if the received signal power level is less than the threshold value.

2. The FDD wireless communication apparatus of claim 1, further comprising:
    a low noise amplifier (LNA) connected between the second antenna and the switch.

3. The FDD wireless communication apparatus of claim 1, wherein a junction among the first antenna, a transmitter, and the switch is one of a combination of a T-junction, a transmission surface acoustic wave (SAW) filter, or a reception SAW filter, a circulator, or a duplexer.

4. The FDD wireless communication apparatus of claim 2, further comprising:
    a duplexer connected among the first antenna, a transmitter, and the switch;
    a first band pass filter (BPF) connected between the second antenna and the LNA; and
    a second BPF connected between the switch and the receiver.

5. The FDD wireless communication apparatus of claim 1, wherein the at least one processor is further configured to:
    connect the first antenna to the receiver through the switch if the received signal power level is greater than or equal to the threshold value, and
    connect the second antenna to the receiver through the switch if the received signal power level is less than the threshold value.

6. The FDD wireless communication apparatus of claim 5, wherein the threshold value is set to a level for determining whether a reception electric field is a weak electric field.

7. The FDD wireless communication apparatus of claim 1, further comprising:
    a radio frequency (RF) switch connector connected between the first antenna and the junction between a transmitter and the switch,
    wherein the at least one processor is further configured to control switching of the switch for a test of at least one of transmission and reception by using test equipment connected at the junction between the transmitter and the switch through the RF switch connector.

8. The FDD wireless communication apparatus of claim 7, wherein the at least one processor is further configured to connect the receiver to the RF switch connector through the switch for the test.

9. A frequency division duplex (FDD) wireless communication apparatus comprising:
    multiple transmitters and receivers corresponding to multiple different communication bands;
    a first antenna configured to one of transmit and receive;
    a second antenna configured to receive;
    a first switch configured to selectively connect the first antenna to a transmitter corresponding to a communication band used out of the multiple communication bands;
    a second switch configured to selectively connect one of the first antenna and the second antenna to a receiver corresponding to the used communication band through the first switch; and
    at least one processor configured to:
        control switching of the second switch based on a received signal power level,
        control to transmit and receive a signal via the first antenna, if the received signal power level is greater than or equal to a threshold value, and control to transmit a signal via the first antenna and receive a signal via the second antenna, if the received signal power level is less than the threshold value.

10. The FDD wireless communication apparatus of claim 9, wherein the at least one processor is further configured to:
connect the first antenna to a receiver corresponding to the used communication band through the first switch and the second switch if the received signal power level is greater than or equal to the threshold value, and
connect the second antenna to the receiver corresponding to the used communication band through the second antenna if the received signal power level is less than the threshold value.

11. The FDD wireless communication apparatus of claim 10, wherein the threshold value is set to a level for determining whether a reception electric field is a weak electric field.

12. A frequency division duplex (FDD) wireless communication method comprising:
connecting one of a first antenna for one of transmitting or receiving and a second antenna for receiving to a receiver;
transmitting and receiving a signal via the first antenna, if the received signal power level is greater than or equal to a threshold value; and
transmitting a signal via the first antenna and receiving a signal via the second antenna, if the received signal power level is less than the threshold value.

13. The FDD wireless communication method of claim 12, wherein the receiving of the wireless signal comprises low-noise-amplifying of a signal received via the second antenna and providing the low-noise-amplified signal to the receiver, if connecting the second antenna to the receiver.

14. The FDD wireless communication method of claim 12, wherein the connecting of the selected antenna to the receiver comprises:
connecting the first antenna to the receiver if the received signal power level is greater than or equal to the threshold value; and
connecting the second antenna to the receiver if the received signal power level is less than the threshold value.

15. The FDD wireless communication method of claim 14, wherein the threshold value is set to a level for determining whether a reception electric field is a weak electric field.

16. The FDD wireless communication method of claim 12, further comprising:
connecting the receiver to a Radio Frequency (RF) switch connector connected between the first antenna and a transmitter for a reception test using test equipment connected through the RF switch connector.

17. A non-transitory computer-readable storage medium storing instructions that, when executed, cause at least one processor to be configured to perform the method of claim 12.

* * * * *